United States Patent
Tominaga et al.

(10) Patent No.: US 8,396,335 B2
(45) Date of Patent: Mar. 12, 2013

(54) SOLID-STATE MEMORY AND SEMICONDUCTOR DEVICE

(75) Inventors: Junji Tominaga, Tsukuba (JP); Takayuki Shima, Tsukuba (JP); Alexander Kolobov, Tsukuba (JP); Paul Fons, Tsukuba (JP); Robert Simpson, Tsukuba (JP)

(73) Assignee: Elpida Memory, Inc., Tokyo (JP)

( * ) Notice: Subject to any disclaimer, the term of this patent is extended or adjusted under 35 U.S.C. 154(b) by 431 days.

(21) Appl. No.: 12/690,711

(22) Filed: Jan. 20, 2010

(65) Prior Publication Data

US 2010/0181548 A1 Jul. 22, 2010

(30) Foreign Application Priority Data

Jan. 22, 2009 (JP) ................ P2009-012238

(51) Int. Cl.
*H01L 45/00* (2006.01)
(52) U.S. Cl. .......................................................... 385/2
(58) Field of Classification Search ................ 257/2, 4, 257/5
See application file for complete search history.

(56) References Cited

U.S. PATENT DOCUMENTS

| | | |
|---|---|---|
| 2002/0131309 A1 | 9/2002 | Nishihara et al. |
| 2006/0209495 A1* | 9/2006 | Lee et al. ................ 361/502 |
| 2007/0160760 A1* | 7/2007 | Shin et al. ............ 427/255.35 |
| 2007/0181867 A1* | 8/2007 | Hewak et al. ................ 257/4 |
| 2009/0280052 A1* | 11/2009 | Xiao et al. ................ 423/508 |

FOREIGN PATENT DOCUMENTS

| | | |
|---|---|---|
| JP | 8-85261 | 4/1996 |
| JP | 2001-96919 | 4/2001 |
| JP | 2002-203392 | 7/2002 |
| JP | 2005-170059 | 6/2005 |
| WO | WO 2008057616 A2 * | 5/2008 |

OTHER PUBLICATIONS

Tsunoda, Y. et al. (Oct. 15, 1995). "Basics and Applications of Optical Disk Storage" The Institute of Electronics, Information and Communication Engineers (IEICE).pp. 204-209 (with Partial English translation).
Kolobov, A. et al. (Oct. 2004). "Understanding the Phase-Change Mechanism of Rewritable Optical Media." *Nature Materials*.3:703-708.
Okuda, M. (Jan. 31, 2004)."Technology and Materials for Future Optical Memories." CMC Publishing Co., Ltd. pp. 109-120 (with Partial English translation).
Yamada, N. (Dec. 15, 2000)."Structure of Laser-Crystallized $Ge_2Sb_{2+x}Te_5$ Sputtered Thin Film for Use in Optical Memory." *Journal of Applied Science*. 88(12):7020-7028.

* cited by examiner

*Primary Examiner* — Thomas L Dickey
(74) *Attorney, Agent, or Firm* — Morrison & Foerster LLP

(57) ABSTRACT

A solid memory may include a recording layer including Ge, Sb and Te as major components. The recording layer may include a superlattice. The recording layer may include multi-layers each having a parent phase showing a phase transformation in solid-states, the phase transformation causing change in electrical property of the recording layer. The recording layer may include an $Sb_2Te_3$ layer that includes at least one period of a first lamination of a first Te-atomic layer, a first Sb-atomic layer, a second Te-atomic layer, a second Sb-atomic layer, and a third Te-atomic layer in these order, a GeTe layer that includes at least one period of a second lamination of a fourth Te-atomic layer and a Ge-atomic layer, and an Sb layer that includes a plurality of Sb-atomic layers.

17 Claims, 3 Drawing Sheets

FIG. 4A
FIG. 4B
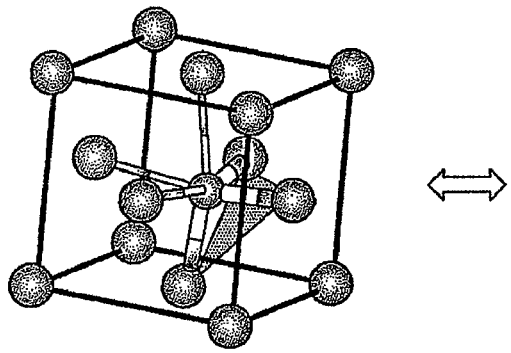 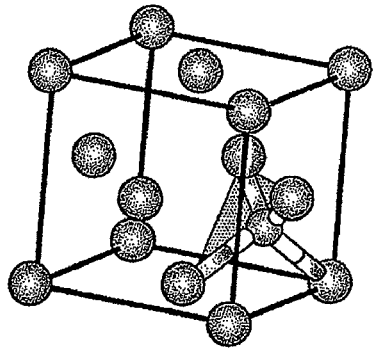

US 8,396,335 B2

SOLID-STATE MEMORY AND SEMICONDUCTOR DEVICE

Priority is claimed on Japanese Patent Application No. 2009-012238, filed Jan. 22, 2009, the content of which is incorporated herein by reference.

BACKGROUND OF THE INVENTION

1. Field of the Invention

The present invention generally relates to a solid-state memory and a semiconductor device including a recording layer in which a phase transformation is made between a crystal state and an amorphous state. The recording layer of the present invention has a resistance difference between the crystal state and the amorphous state that can be utilized in recording and erasing of data. More specifically, the present invention relates to a phase-change random access memory, hereinafter referred to as a PRAM.

2. Description of Related Art

A PRAM performs recording and erasing of data by a change in physical properties of a recording layer. The change is caused by a primary phase transformation of the recording layer. The primary phase transformation is made between a crystal state and an amorphous state of the recording layer. Typically, the recording layer may be a Te-containing chalcogen compound. The PRAM has been designed based on those fundamental principles. The PRAM is described in Japanese Unexamined Patent Application, First Publication, No. 2002-203392, in p. 114 of "Technology and Materials for Future Optical Memories," by Masahiro Okuda, CMC Publishing Co., Ltd., Jan. 31, 2004, and in p. 209 of "Basics and Applications of Optical Disk Storage," by Yoshito Tsunoda et al., The Institute of Electronics, Information and Communication Engineers, 1995.

The recording layer that is used for the PRAM that performs recording and erasing of data can generally be formed by utilizing a vacuum film formation method such as a sputtering method between electrodes. In general, the recording layer can be realized by a single layered structure of an alloy thin film that is formed by using a compound target. The thickness of the alloy thin film is between 20 nm and 50 nm, and the alloy thin film is realized not by a single crystal but by a polycrystal.

There has been performed analyzation of the crystal structure and amorphous structure of the Te-containing chalcogen compound by using an X-ray since the second half of 1980. A Te atom and a Sb atom included in the Te-containing chalcogen compound have adjacent atomic numbers. The electron numbers of the Te atom and the Sb atom are only different by one. It is difficult to distinguish the difference using an X-ray diffraction method or an electron beam diffraction method. The detailed structure of the Te-containing chalcogen compound was unknown until 2004.

The chalcogen compound including Ge, Sb and Te has been realized as the recording layer which, for example, can be used as an optical recording medium. GeSbTe (225) and a compound similar to GeTe—$Sb_2Te_3$ (225, 147, 125) are examples of the chalcogen compound that are experimentally known as having good properties. The crystal structure of the chalcogen compound is similar to the simple cubic lattice of NaCl. Te atom is at a site corresponding to Na of the NaCl structure, and Ge atom or Sb atom is at a site corresponding to Cl of the NaCl structure. The atomic arrangement in the chalcogen compound was thought to be random. Those are described in p. 7020-7028 of "Structure of Laser-Crystallized $Ge_2Sb_{2+x}Te_5$ Sputtered Thin Films for Use in Optical Memory," by Yamada, T. Matsunaga, Journal of Applied Physics, 88, 2000, for example.

There has been performed analyzation of the crystal structure of the Ge—Sb—Te compound using a synchrotron radiation facility. The analyzation is described in "Understanding the phase-change mechanism of rewritable optical media" by A. V. Kolobov et al., Nature Materials 3, 703, 2004.

A typical result of the above analyzation will be described. FIG. 2 is a view of the crystal state of the Ge—Sb—Te compound. The crystal of the Ge—Sb—Te compound is constituted of Te atoms 1, Sb atoms 2, and Ge atoms 3. The crystal structure of the Ge—Sb—Te compound is similar to the simple cubic lattice of NaCl. The Te atoms 1 are at the site corresponding to Na of the NaCl structure, and the Sb atoms 2 or the Ge atoms 3 are at the site corresponding to Cl of the NaCl structure. The atomic arrangement in the crystal state of the Ge—Sb—Te compound is not random. The crystal structure of the Ge—Sb—Te compound is distorted.

FIG. 3 is a view of the amorphous state of the Ge—Sb—Te compound. The atomic arrangement in the amorphous state of the Ge—Sb—Te compound is not random. The configuration of the amorphous state of the Ge—Sb—Te compound is distorted a little maintaining the configuration. In the crystal state, the Ge atoms 3 shift by 2 angstrom toward the Te atoms 1. But the crystal structure is slightly shifted, while maintaining the unit of the crystal structure. By the shifting of the Ge atoms 3, the Ge—Sb—Te compound slightly comes toward ferroelectric states.

FIG. 4A is another view of the crystal state of the Ge—Sb—Te compound corresponding the state of FIG. 2. FIG. 4B is another view of the amorphous state of the Ge—Sb—Te compound corresponding to the state of FIG. 3. High speed switching operation is performed between the crystal state of FIG. 4A and the amorphous state of FIG. 4B. The high speed switching operation is performed repeatedly by restoring the distorted structure.

The current used in recording and erasing of data in a solid memory needs to be decreased. The number of the times recording and erasing of data can be repeated needs to be increased. A main limiting factor to the number of the times recording and erasing of data can be repeated is heat flow of a recording film at high temperatures or a subsequent transition of the recording film. This analyzation is described on p. 209 of "Basics and Applications of Optical Disk Storage," by Yoshito Tsunoda et al., The Institute of Electronics, Information and Communication Engineers, 1995, for example.

SUMMARY

A solid memory may include a recording layer including Ge, Sb and Te as major components. The recording layer may include a superlattice. The recording layer may include multilayers each having a parent phase showing a phase transformation in solid-states, the phase transformation causing change in electrical property of the recording layer. The recording layer may include an $Sb_2Te_3$ layer that includes at least one period of a first lamination of a first Te-atomic layer, a first Sb-atomic layer, a second Te-atomic layer, a second Sb-atomic layer, and a third Te-atomic layer in these order, a GeTe layer that includes at least one period of a second lamination of a fourth Te-atomic layer and a Ge-atomic layer, and an Sb layer that includes a plurality of Sb-atomic layers.

A semiconductor device may include a first electrode, a recording layer on the first electrode, and a second electrode on the recording layer. The recording layer may include Ge, Sb and Te as major components. The recording layer may include a superlattice. The recording layer may include multilayers each having a parent phase showing a phase transformation in solid-states, the phase transformation causing change in electrical property of the recording layer. The recording layer may include an $Sb_2Te_3$ layer that includes at least one period of a first lamination of a first Te-atomic layer, a first Sb-atomic layer, a second Te-atomic layer, a second Sb-atomic layer, and a third Te-atomic layer in these order, a GeTe layer that includes at least one period of a second lamination of a fourth Te-atomic layer and a Ge-atomic layer, and an Sb layer that includes a plurality of Sb-atomic layers.

A solid memory may include a recording layer including Ge, Sb and Te as major components. The recording layer may include multi-layers each having a parent phase showing a phase transformation in solid-states, the phase transformation causing change in electrical property of the recording layer, the multi-layers forming a superlattice. The recording layer may include an $Sb_2Te_3$ layer and a GeTe layer adjacent to the $Sb_2Te_3$ layer.

BRIEF DESCRIPTION OF THE DRAWINGS

The above features and advantages of the present invention will be more apparent from the following description of certain preferred embodiments taken in conjunction with the accompanying drawings, in which:

FIG. 4A is another view of the crystal state of the Ge—Sb—Te compound corresponding the state of FIG. 2; and FIG. 4B is another view of the amorphous state of the Ge—Sb—Te compound corresponding to the state of FIG. 3.

DETAILED DESCRIPTION OF THE PREFERRED EMBODIMENTS

Figure 1:
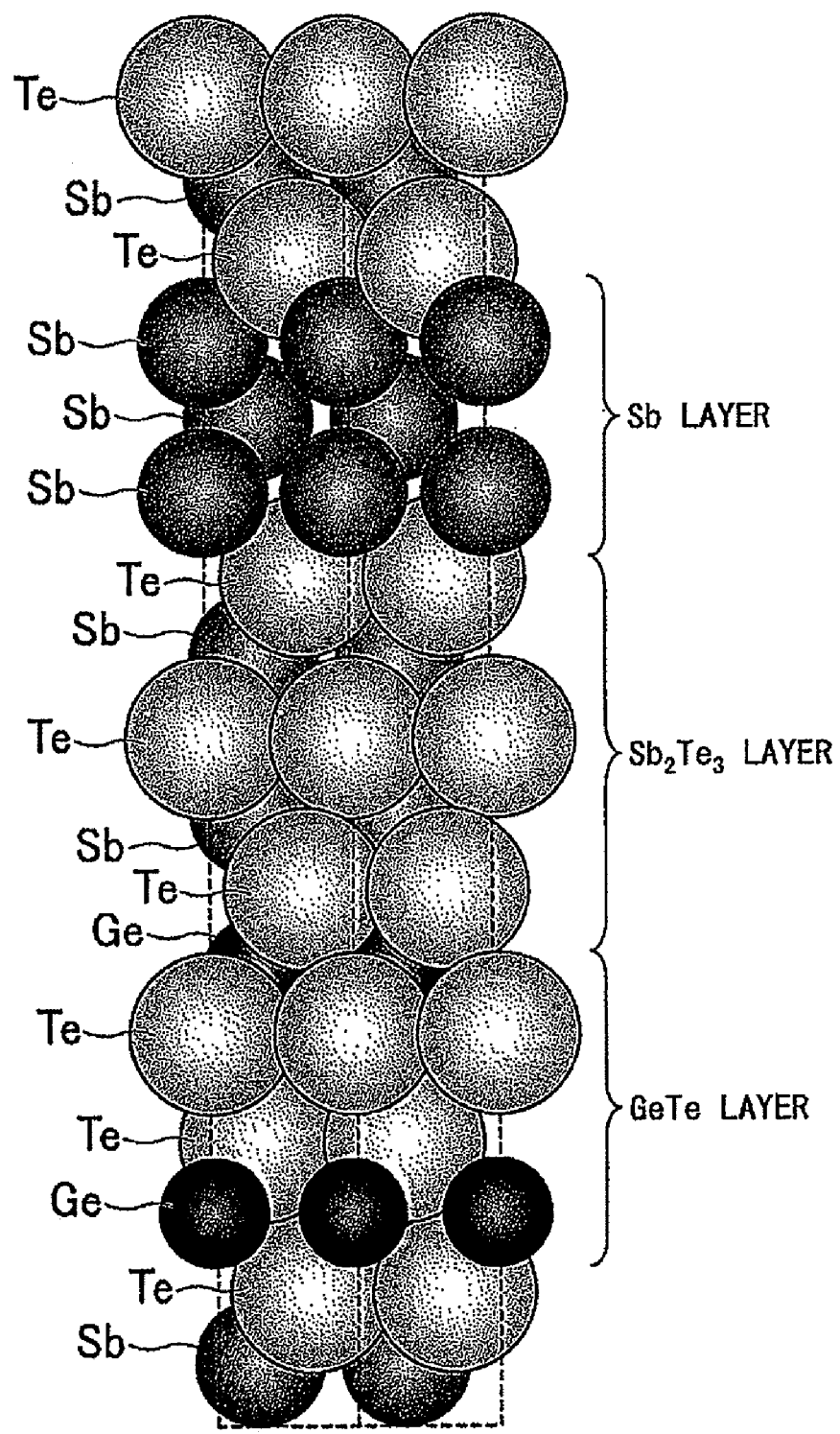
FIG. 1 is a view of a crystal structure of a recording layer of the solid-state memory in accordance with a first preferred embodiment of the present invention.

There has been performed analyzation of the solid memory that needs small current in recording and erasing of data and has large number of times recording and erasing of data can be repeated.

The PRAM performs recording and erasing of data using the change in physical properties of the recording layer. The change is caused by the primary phase transformation of the recording layer. The first-order phase transition is made between the crystal state and the amorphous state of the recording layer. Typically, the recording layer may be the Te-containing chalcogen compound. The recording layer is composed of not a single crystal but of a polycrystal. Therefore, resistance values of the recording layer have variations. When a phase change is made, changes in the volume of the recording layer grow greater. As a result, the current used in recording and erasing of data is increased, and the number of times recording and erasing of data can be repeated is limited.

It was discovered that by a superlattice structure of the chalcogen compound including Ge and Te using a plurality of laminations, electric resistance of the boundary between microcrystals is decreased and the times recording and erasing of data can be repeated is increased using a method similar to the method in recording and erasing of data in Te alloy including Ge.

A solid memory may include a recording layer including Ge, Sb and Te as major components. The recording layer may include a superlattice. The recording layer may include multi-layers each having a parent phase showing a phase transformation in solid-states, the phase transformation causing change in electrical property of the recording layer. The recording layer may include an $Sb_2Te_3$ layer that includes at least one period of a first lamination of a first Te-atomic layer, a first Sb-atomic layer, a second Te-atomic layer, a second Sb-atomic layer, and a third Te-atomic layer in these order, a GeTe layer that includes at least one period of a second lamination of a fourth Te-atomic layer and a Ge-atomic layer, and an Sb layer that includes a plurality of Sb-atomic layers.

The recording layer has the superlattice structure. The direction of movement of atoms of the recording layer can be controlled in recording and erasing of data. In comparison with an alloy composing of the same composition as the superlattice structure, input energy is more effectively transferred to work energy to generate the first-order phase transition against entropy dissipation because of the coherent atom movement. As a result, energy efficiency to perform the phase transformation can be improved, and performance of the PRAM can be improved.

The volumetric change of the recording layer in recording and erasing of data can be reduced, and behavior of recording and erasing of data becomes stable, not causing segregation of composition.

As a result, the current used in recording and erasing of data is decreased, and the number of the times recording and erasing of data can be repeated is increased.

The number of the plurality of Sb-atomic layers may be not more than six and not less than three.

The multi-layers may include laminations of the $Sb_2Te_3$ layer, the GeTe layer, the $Sb_2Te_3$ layer, and the Sb layer in these order.

The multi-layers may include the Sb layer and alternating laminations of the Sb layer and the GeTe layer.

Recording and erasing of data may be performed by an anisotropic diffusion of Ge atoms from the GeTe layer to a boundary between the GeTe layer and the $Sb_2Te_3$ layer.

Recording and erasing of data may be performed by an anisotropic diffusion of Ge atoms into the GeTe layer from a boundary between the GeTe layer and the $Sb_2Te_3$ layer.

A thickness of each of the $Sb_2Te_3$ layer, the GeTe layer and the Sb layer may be between 0.1 nm and 2 nm.

In the first lamination, the first Sb-atomic layer may be adjacent to the first Te-atomic layer, the second Te-atomic layer may be adjacent to the first Sb-atomic layer, the second Sb-atomic layer may be adjacent to the second Te-atomic layer, and the third Te-atomic layer may be adjacent to the second Sb-atomic layer.

In the second lamination, the Te-atomic layer and the Ge-atomic layer may be adjacent to each other.

The $Sb_2Te_3$ layer and the GeTe layer may be adjacent to each other.

A total amount of Ge, Sb and Te in the recording layer may be equal to or more than 50 wt.-%.

A semiconductor device may include a first electrode, a recording layer on the first electrode, and a second electrode on the recording layer. The recording layer may include Ge, Sb and Te as major components. The recording layer may include a superlattice. The recording layer may include multi-layers each having a parent phase showing a phase transformation in solid-states, the phase transformation causing change in electrical property of the recording layer. The recording layer may include an $Sb_2Te_3$ layer that includes at least one period of a first lamination of a first Te-atomic layer, a first Sb-atomic layer, a second Te-atomic layer, a second Sb-atomic layer, and a third Te-atomic layer in these order, a GeTe layer that includes at least one period of a second lamination of a fourth Te-atomic layer and a Ge-atomic layer, and an Sb layer that includes a plurality of Sb-atomic layers.

As a result, the current used in recording and erasing of data is decreased, and the number of the times recording and erasing of data can be repeated is increased.

The present invention will now be described herein with reference to illustrative embodiments. Those skilled in the art will recognize that many alternative embodiments can be accomplished using the teachings of the present invention and that the invention is not limited to the embodiments illustrated herein for explanatory purposes.

First Preferred Embodiment

The present invention forms a superlattice structure of a chalcogen compound including Ge and Te in a recording film of a PRAM by forming a layer of films. Electrical resistance of the boundary between microcrystals can be decreased by using a method that is similar to the method in recording and erasing of data in Te alloy including Ge. The number of times recording and erasing of data can be repeated can be increased.

The term "major component" will be used to describe that a substance includes more than 50% by mass of the component. Specifically, "the recording layer includes Ge, Sb and Te as major components" means that the recording layer includes more than 50% by mass of Ge, Sb, and Te.

A solid memory may include a recording layer including Ge, Sb and Te as major components. The recording layer may include a superlattice. The recording layer may include multilayers each having a parent phase showing a phase transformation in solid-states, the phase transformation causing change in electrical property of the recording layer. The recording layer may include an $Sb_2Te_3$ layer that includes at least one period of a first lamination of a first Te-atomic layer, a first Sb-atomic layer, a second Te-atomic layer, a second Sb-atomic layer, and a third Te-atomic layer in these order, a GeTe layer that includes at least one period of a second lamination of a fourth Te-atomic layer and a Ge-atomic layer, and an Sb layer that includes a plurality of Sb-atomic layers. The number of the plurality of Sb-atomic layers may be not more than six and not less than three.

The term "superlattice" is used to describe a crystal lattice that has a structure that repeats a unit structure in a cycle. The cycle of the unit structure is longer than the cycle of a unit lattice. The structure is formed by various kinds of crystal lattices. The term "superlattice structure" is used to describe the structure of the above-mentioned crystal lattice.

The term "parent phase" is used to describe a phase that occupies the largest volume among the phases that constitute a film. "The parent phase shows the phase transformation between states." means that the parent phase shows the phase transformation between two states, for example, the crystal state and the amorphous state, solid states of the two states being the same. The film having a parent phase that shows the phase transformation may preferably be the film composed only of the parent phase that shows the phase transformation.

The solid memory in accordance with the first preferred embodiment of the present invention is formed by a method including a process of forming the recording layer having the superlattice structure. The process is performed by forming films including the parent phase that shows the phase transformation between states.

In the process of forming the recording layer, it may be preferable to form a Ge containing film and a Sb containing film adjacently.

Furthermore, it may be more preferable to form a GeTe containing film and a $Sb_2Te_3$ containing film adjacently. Thereby, the superlattice structure of a GeTe layer and a $Sb_2Te_3$ layer is formed.

In the superlattice structure of the GeTe layer and the $Sb_2Te_3$ layer, a Ge atom in the GeTe layer can be diffused to a boundary between the GeTe layer and the $Sb_2Te_3$ layer using an electric energy that is input to a memory. "A crystal having anisotropy" that has the structure similar to the structure of the crystal state can be formed in the recording layer. Forming of the crystal having anisotropy corresponds to one of an erasing state or a recording state.

The Ge atom formed on the boundary can be shifted into the GeTe layer using the electric energy that is input to the memory. "The structure similar to an amorphous" that has the same resistance value as the resistance value of a random structure that is conventionally called as the amorphous can be formed in the recording layer. Forming of the structure similar to the amorphous corresponds to the one of the recording state or the erasing state that is different from the state of forming of the crystal having anisotropy.

In the method of forming the solid memory in accordance with the first preferred embodiment of the present invention, the superlattice structure is formed, and the directions of the movements of the Ge atoms between the two states can be made the same. The Ge atoms perform an anisotropic diffusion between the two states. In comparison with an alloy composing of the same composition as the superlattice structure, input energy is more effectively transferred to work energy to generate the first-order phase transition against entropy dissipation because of the coherent atom movement. As a result, energy efficiency to perform the phase transformation can be improved, and performance of the PRAM can be improved.

"Anisotropy" is used to describe that the physical properties are different by the direction. "The crystal having anisotropy" describes the crystal which physical properties are different by the direction. "The anisotropic diffusion" describes diffusion which is biased to one direction.

In the above-mentioned method of forming the recording layer, the Sb layer of the Sb-atomic layers the number of which is not more than six and not less than three and either the GeTe layer or the $Sb_2Te_3$ layer that constructs the superlattice structure are preferably formed alternately. By forming the Sb layer and either the GeTe layer or the $Sb_2Te_3$ layer alternately, recording and erasing of data can be performed using less electric power.

When the number of the Sb-atomic layers that construct the Sb layer is not more than six and not less than three, the influence of electrons that move from the Sb layer to another layer can be suppressed. Even if the Ge atom diffuses from a superlattice layer including the Sb atom to the GeTe layer that is the parent phase, the difference between the resistance value before the diffusing of the Ge atom and the resistance value after the diffusing of the Ge atom can be increased.

In the method of forming the recording layer, the superlattice structure is preferably formed by forming a first $Sb_2Te_3$ layer, forming the GeTe layer on the first $Sb_2Te_3$ layer, forming a second $Sb_2Te_3$ layer on the GeTe layer, and forming the Sb layer on the second $Sb_2Te_3$ layer. Each of the first and second $Sb_2Te_3$ layers may include a first, second and third Te-atomic layers and a first and second Sb-atomic layers, the first Sb-atomic layer being formed on the first Te-atomic layer, the second Te-atomic layer being formed on the first Sb-atomic layer, the second Sb-atomic layer being formed on the second Te-atomic layer, the third Te-atomic layer being formed on the second Sb-atomic layer. The GeTe layer may include at least one of a second period of atomic layers, the second period of atomic layers including a fourth Te-atomic layer and a Ge-atomic layer, the fourth Te-atomic layer and the Ge-atomic layer being formed alternately. The Sb layer may include a plurality of Sb-atomic layers, the number of the plurality of Sb-atomic layers being not more than six and not less than three on the GeTe layer.

The $Sb_2Te_3$ layer may be the film including a unit of (Te—Sb—Te—Sb—Te). The $Sb_2Te_3$ layer may be the film including a plurality of units of (Te—Sb—Te—Sb—Te), and be in the structure such as (Te—Sb—Te—Sb—Te) where n is an arbitrary integer.

The GeTe layer may be a film including the unit of Te—Ge or Ge—Te. The GeTe layer may be a film including the plurality of units such as $(Te—Ge)_n$ or $(Ge—Te)_n$ where n is the arbitrary integer.

"The atomic layer" describes a monoatomic layer in which atoms of the layers are arranged in two dimensions.

In the method of forming the solid memory in accordance with the first preferred embodiment of the present invention, the thickness of the film including the parent phase that shows the phase transformation between states may preferably be between 0.1 nm and 2 nm, but is not limited thereto. The thickness of each of the films described in the present invention can be measured by a cross-section observation using a transmission electron microscope.

FIG. 1 is the view of the crystal structure of the recording layer of the solid-state memory in accordance with the first preferred embodiment of the present invention. The structure of FIG. 1 includes the GeTe layer, the $Sb_2Te_3$ layer and the Sb layer. The $Sb_2Te_3$ layer is formed on the GeTe layer. The Sb layer is formed on the $Sb_2Te_3$ layer. The GeTe layer includes a first and second Ge-atomic layers and a first and second Te-atomic layers. The first Te-atomic layer is formed on the first Ge-atomic layer. The second Te-atomic layer is formed on the first Te-atomic layer. The second Ge-atomic layer is formed on the second Te-atomic layer. The $Sb_2Te_3$ layer includes a third, fourth and fifth Te-atomic layers and a first and second Sb-atomic layers. The first Sb-atomic layer is formed on the third Te-atomic layer. The fourth Te-atomic layer is formed on the first Sb-atomic layer. The second Sb-atomic layer is formed on the fourth Te-atomic layer. The fifth Te-atomic layer is formed on the second Sb-atomic layer. The Sb layer includes three Sb-atomic layers.

Figure 2:
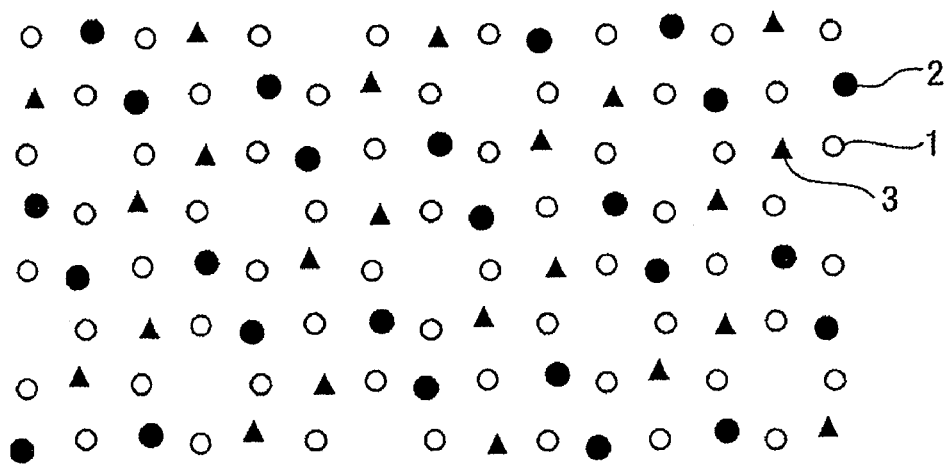
FIG. 2 is a view of the crystal state of the Ge—Sb—Te compound in accordance with the related art.
Figure 3:
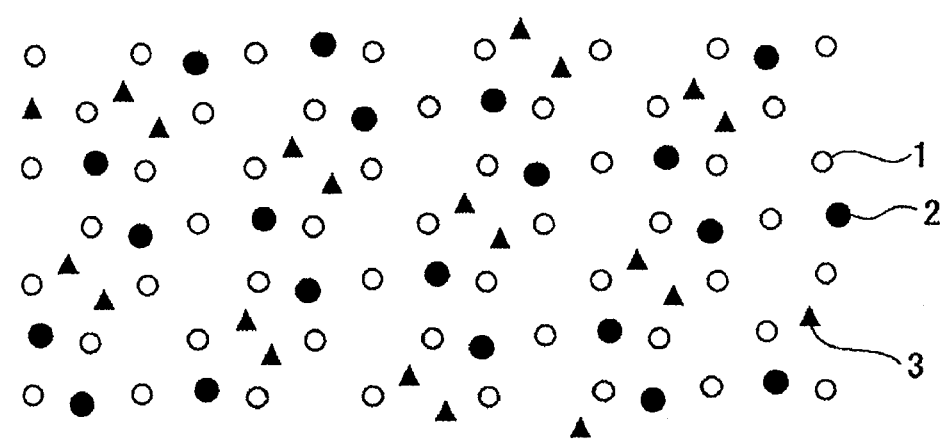
FIG. 3 is a view of the amorphous state of the Ge—Sb—Te compound in accordance with the related art.

The longitudinal direction of FIG. 1 is in parallel with the c-axis of a hexagonal crystal. The crystal structure of FIG. 1 is not a cubic crystal as illustrated in FIGS. 2 and 3. The thickness of the GeTe layer may be 0.79 nm. The thickness of the $Sb_2Te_3$ layer may be 0.98 nm. The thickness of the Sb layer including three Sb-atomic layers in FIG. 1 may be 0.59 nm.

In the superlattice structure of FIG. 1, each of the Ge atoms moves in one direction, so the movement of the Ge atoms is coherent. Much input energy can be used as not heat energy but work energy, and the amount of released heat energy can be restricted. As a result, energy efficiency to perform the phase transformation can be improved.

When a conventional recording layer that is composed of one layer of a compound target including Ge, Sb and Te is used, the conventional recording layer includes various kinds of microcrystals. Each of the Ge atoms moves at random in the conventional recording layer corresponding to the microcrystal. The electric energy that is input for moving the Ge atoms in the conventional recording layer is not coherent. Much heat energy is released in the conventional recording layer based on thermodynamics.

In the superlattice structure of FIG. 1, volumetric change when recording and erasing of data is suppressed under 3% by using a structure similar to the amorphous structure, while the volumetric change in the conventional structure is more than 5%. The volumetric change occurs along one axis, and is resistant to a compositional segregation. Thereby, recording and easing of data can be repeated in stable.

Prior art such as a sputtering method and a vapor growth method can be used in forming the above-mentioned film of the solid memory in accordance with the first preferred embodiment of the present invention.

When using the sputtering method, compound target of Sb, compound target of GeTe and compound target of $Sb_2Te_3$ are used. Alternatively, a target of Sb, a target of Ge and a target of Te are used. By measuring in advance the speeds of forming a film by the electric power that is input for the sputtering, the superlattice structure of the films can be easily formed only by controlling the film-forming time.

The recording layer of the solid memory is described above. Other components that are necessary to the solid memory such as an electrode and a unit of reading and writing of data in the memory can have the same configuration as that of the prior art such as Japanese Unexamined Patent Application, First Publication, No. 2002-203392. Such other components can be formed using the same method as that of the prior art.

The method of forming the solid memory or the semiconductor device will be described. A lower electrode that is a first electrode is formed on the substrate by, for example, the sputtering. The recording layer described above is formed on the first electrode. An upper electrode that is a second electrode is formed on the recording layer by, for example, the sputtering. The solid memory or the semiconductor device includes the substrate, the lower electrode, the recording layer and the upper electrode. In the semiconductor device, electrical energy is supplied to the recording layer through each electrode. The semiconductor device can perform writing and erasing of data using the electrical energy.

The material that configures the lower electrode and the upper electrode may be TiN or W. The material that configures the substrate may be Si.

The invention will now be described herein with reference to examples. Those skilled in the art will recognize that many alternative examples can be accomplished using the teaching of the present invention and that the invention is not limited to the examples illustrated for explanatory purpose.

EXAMPLE 1

A first PRAM had a basic configuration of a normal self-resistance-heated-type PRAM. Electrodes of the first PRAM were made of TiN on the substrate of Si using a photoresist. A superlattice was constructed using an RF sputtering apparatus of a helicon wave type. The RF sputtering apparatus has targets of pure metals Ge, Sb and Te. Each of the targets was 2 inches in diameter, and the purity of each of the pure metals was 99.99%.

Films were formed using Ar gas at a pressure of 0.47 Pa. The Te target was applied with an electric power of 12.5 W. The Sb target was applied with an electric power of 12.8 W. The Ge target was applied with an electric power of 45 W.

Coils were disposed on each target to stabilize plasma of the targets. The coils were applied with an electric power of 20 W. The distance between the substrate and the target was 200 mm. The recording film was made of 15 layers of the superlattice that had the structure of [—Te—Sb—Te—Sb—Te—/—Ge—Te—Te—Ge—/—Te—Sb—Te—Sb—Te/—Sb—Sb—Sb—].

The thickness of the whole of the recording film of the superlattice was 25 nm. The size of cell of the first PRAM was 100 nm×100 nm.

The current of the first PRAM were measured by applying voltage to the first PRAM. The application of the voltage was made based on a program. When the first PRAM performed resetting of data, the first PRAM was crystallized and the current was 0.1 mA with 10 ns of time. The limit of the number of the times recording and erasing of data could be repeated was $10^{15}$ at this current. The resistance of the amorphous state was 2000 times larger than the resistance of the crystal state.

The thickness of the GeTe layer was 0.82 nm. The thickness of the $Sb_2Te_3$ layer was 0.98 nm. The thickness of the Sb layer was 0.60 nm.

COMPARATIVE EXAMPLE 1

A second was prepared for comparison, and had the basic configuration of a normal self-resistance-heated-type PRAM like the first PRAM.

Electrodes of the second PRAM were made of TiN on the substrate of Si using the photoresist. The superlattice was made using an RF sputtering apparatus of the helicon wave type. The RF sputtering apparatus has targets of pure metals Ge, Sb and Te. Each of the targets was 2 inches in diameter, and the purity of each of the pure metals was 99.99%.

Films were formed using Ar gas at the pressure of 0.47 Pa. The Te target was applied with an electric power of 12.5 W. The Sb target was applied with an electric power of 12.8 W. The Ge target was applied with an electric power of 45 W.

Coils were disposed on each target to stabilize plasma of the targets. The coils were applied with 20 W. The distance between the substrate and the target was 200 mm. Electrodes of the second PRAM were made of TiN. The recording film was made of 10 layers of the superlattice that had the structure of [—Te—Sb—Te—Sb—Te—/—Ge—Te—Te—Ge—/—Te—Sb—Te—Sb—Te/—Sb—Sb—Sb—Sb—Sb—Sb—Sb—Sb—Sb—].

The thickness of the recording film of the superlattice was 22 nm. The size of cell of the second PRAM was 100 nm×100 nm.

The current of the second PRAM were measured by applying voltage to the second PRAM. The application of the voltage was made based on the program. When the second PRAM performed resetting of data, the second PRAM was crystallized and the current was 0.05 mA with 10 ns of time. The limit of the number of the times recording and erasing of data could be repeated was $10^{15}$ at this current. The resistance of the amorphous state was 500 times larger than the resistance of the crystal state.

The thickness of the GeTe layer was 0.82 nm. The thickness of the $Sb_2Te_3$ layer was 0.98 nm. The thickness of the Sb layer was 1.71 nm.

COMPARATIVE EXAMPLE 2

A third PRAM was prepared for comparison, and had the basic configuration of a normal self-resistance-heated-type PRAM like the first PRAM.

The recording film of the third PRAM was made of $Ge_2Sb_7Te_8$. The thickness of the recording film was 25 nm. The size of cell of the third PRAM was 100 nm×100 nm.

The current of the third PRAM were measured by applying voltage to the third PRAM. The application of the voltage was made based on the program. When the third PRAM performed resetting of data, the third PRAM was crystallized and the current was 1.6 mA with 150 ns of time. The limit of the number of the times recording and erasing of data could be repeated was $10^7$ at this current. The resistance of the amorphous state was 5000 times larger than the resistance of the crystal state.

As described above, it was confirmed that the first PRAM of the first example had less electrical resistance in the boundary between microcrystals. The current when recording of data in the first PRAM was less than a tenth of the current of the third PRAM that is the prior art. The number of the times recording and erasing of data could be repeated in the first PRAM was made 8-digits more than in the third PRAM that is the prior art.

The recording layer is typically used as a channel of the solid memory such as the PRAM. The above description is applied to the recording layer for a solid memory such as the PRAM. The present invention is not limited to the recording layer for the solid memory such as the PRAM, but can be applied to all solid memories and other related devices.

It is apparent that the present invention is not limited to the above embodiments, and may be modified and changed without departing from the scope and spirit of the invention.

What is claimed is:

1. A solid memory comprising:
   a recording layer comprising Ge, Sb and Te as major components, the recording layer comprising a superlattice comprising multiple laminations, the recording layer comprising multi-layers showing a phase transformation in solid-states, the phase transformation causing change in electrical property of the recording layer,
   the recording layer comprising:
   an $Sb_2Te_3$ layer that includes at least one period of a first lamination of a first Te-atomic layer, a first Sb-atomic layer, a second Te-atomic layer, a second Sb-atomic layer, and a third Te-atomic layer in these order;
   a GeTe layer that includes at least one period of a second lamination of a fourth Te-atomic layer and a Ge-atomic layer; and
   an Sb layer that includes a plurality of Sb-atomic layers.

2. The solid memory according to claim 1, wherein the number of the plurality of Sb-atomic layers is not more than six and not less than three.

3. The solid memory according to claim 1, wherein the multi-layers comprise laminations of the $Sb_2Te_3$ layer, the GeTe layer, the $Sb_2Te_3$ layer, and the Sb layer in these order.

4. The solid memory according to claim 1, wherein the multi-layers comprise the Sb layer and alternating laminations of the Sb layer and the GeTe layer.

5. The solid memory according to claim 1, wherein a thickness of each of the $Sb_2Te_3$ layer, the GeTe layer and the Sb layer is between 0.1 nm and 2 nm.

6. The solid memory according to claim 1, wherein in the first lamination, the first Sb-atomic layer is adjacent to the first Te-atomic layer, the second Te-atomic layer is adjacent to the first Sb-atomic layer, the second Sb-atomic layer is adjacent to the second Te-atomic layer, and the third Te-atomic layer is adjacent to the second Sb-atomic layer.

7. The solid memory according to claim 1, wherein in the second lamination, the Te-atomic layer and the Ge-atomic layer are adjacent to each other.

8. The solid memory according to claim 1, wherein the $Sb_2Te_3$ layer and the GeTe layer are adjacent to each other.

9. The solid memory according to claim 1, wherein a total amount of Ge, Sb and Te in the recording layer is equal to or more than 50 wt.-%.

10. A semiconductor device comprising:
a first electrode;
a second electrode; and
a recording layer which is sandwiched between the first and the second electrode, the recording layer comprising Ge, Sb and Te as major components, the recording layer comprising a superlattice comprising multiple laminations, the recording layer comprising multi-layers showing a phase transformation in solid-states, the phase transformation causing change in electrical property of the recording layer,
the recording layer comprising:
an $Sb_2Te_3$ layer that includes at least one period of a first lamination of a first Te-atomic layer, a first Sb-atomic layer, a second Te-atomic layer, a second Sb-atomic layer, and a third Te-atomic layer in these order;
a GeTe layer that includes at least one period of a second lamination of a fourth Te-atomic layer and a Ge-atomic layer; and
an Sb layer that includes a plurality of Sb-atomic layers.

11. A solid memory comprising:
a recording layer comprising Ge, Sb and Te as major components,
the recording layer comprising multi-layers showing a phase transformation in solid-states, the phase transformation causing change in electrical property of the recording layer, the multi-layers forming a superlattice comprising multiple laminations,
the recording layer comprising an $Sb_2Te_3$ layer and a GeTe layer adjacent to the $Sb_2Te_3$ layer.

12. The solid memory according to claim 11, further comprising: an Sb layer,
wherein the $Sb_2Te_3$ layer includes at least one period of a first lamination of a first Te-atomic layer, a first Sb-atomic layer, a second Te-atomic layer, a second Sb-atomic layer, and a third Te-atomic layer in these order,
the GeTe layer includes at least one period of a second lamination of a fourth Te-atomic layer and a Ge-atomic layer, and
the Sb layer includes a plurality of Sb-atomic layers.

13. The solid memory according to claim 12, wherein in the first lamination, the first Sb-atomic layer is adjacent to the first Te-atomic layer, the second Te-atomic layer is adjacent to the first Sb-atomic layer, the second Sb-atomic layer is adjacent to the second Te-atomic layer, the third Te-atomic layer is adjacent to the second Sb-atomic layer.

14. The solid memory according to claim 12, wherein in the second lamination, the Te-atomic layer and the Ge-atomic layer are adjacent to each other.

15. The solid memory according to claim 11, further comprising: an Sb layer,
wherein the multi-layers comprise laminations of the $Sb_2Te_3$ layer, the GeTe layer, the $Sb_2Te_3$ layer, and the Sb layer in these order.

16. The solid memory according to claim 11, further comprising: an Sb layer,
wherein the multi-layers comprise the Sb layer and alternating laminations of the Sb layer and the GeTe layer.

17. A semiconductor device including a solid memory, the solid memory comprising:
a first electrode;
a second electrode; and
a recording layer which is sandwiched between the first and second electrode, having a recording state and an erasing state,
wherein the recording layer comprises a single crystalline structure both in the recording state and in the erasing state,
wherein the recording layer comprises Ge, Sb and Te as major components.

* * * * *